United States Patent
Wimplinger et al.

(10) Patent No.: US 9,312,161 B2
(45) Date of Patent: Apr. 12, 2016

(54) ACCOMMODATING DEVICE FOR RETAINING WAFERS

(75) Inventors: Markus Wimplinger, Ried im Innkreis (AT); Thomas Wagenleitner, Aurolzmünster (AT); Alexander Filbert, St. Florian am Inn (AT)

(73) Assignee: EV Group E. Thallner GmbH (AT)

( * ) Notice: Subject to any disclaimer, the term of this patent is extended or adjusted under 35 U.S.C. 154(b) by 144 days.

(21) Appl. No.: 13/994,183

(22) PCT Filed: Dec. 20, 2010

(86) PCT No.: PCT/EP2010/007793
§ 371 (c)(1),
(2), (4) Date: Aug. 9, 2013

(87) PCT Pub. No.: WO2012/083978
PCT Pub. Date: Jun. 28, 2012

(65) Prior Publication Data
US 2013/0330165 A1    Dec. 12, 2013

(51) Int. Cl.
| H01L 21/68 | (2006.01) |
| H01L 21/683 | (2006.01) |
| H01L 21/67 | (2006.01) |
| H01L 21/66 | (2006.01) |

(52) U.S. Cl.
CPC .......... *H01L 21/68* (2013.01); *H01L 21/67288* (2013.01); *H01L 21/683* (2013.01); *H01L 21/67092* (2013.01); *H01L 22/12* (2013.01)

(58) Field of Classification Search
CPC ........ B25B 11/00; B23Q 1/035; H01L 21/68; H01L 21/67092; H01L 21/67288; H01L 22/12; H01L 21/683
USPC .............................................. 269/289 R, 266
See application file for complete search history.

(56) References Cited

U.S. PATENT DOCUMENTS

| 4,475,223 A | 10/1984 | Taniguchi et al. ............... 378/34 |
| 5,094,536 A | 3/1992 | MacDonald et al. .......... 356/358 |
| 2006/0237421 A1 | 10/2006 | Lee et al. ....................... 219/388 |

FOREIGN PATENT DOCUMENTS

| EP | 0 320 297 A2 | 6/1989 | .............. H01L 21/00 |
| EP | 0 411 916 A2 | 2/1991 | ................ G03F 7/20 |
| JP | S 5626437 A | 3/1981 | .............. B23Q 3/08 |
| JP | S 57204547 A | 12/1982 | .............. G03B 27/02 |
| JP | 2004-158610 A | 6/2004 | ............ H01L 21/027 |
| JP | 2008-262971 A | 10/2008 | .............. H01L 21/02 |
| JP | 2011216833 A | 10/2011 | .............. H01L 21/02 |

(Continued)

OTHER PUBLICATIONS

Int'l Search Report from corresponding PCT/EP2012/007793 (Form PCT/ISA/210); 3 pages (English version only).

(Continued)

*Primary Examiner* — Lee D Wilson
*Assistant Examiner* — Jamal Daniel
(74) *Attorney, Agent, or Firm* — Kusner & Jaffe

(57) ABSTRACT

A receiving means for receiving and mounting of wafers. The receiving means includes a mounting surface. A mounting means is provided for mounting a wafer on the mounting surface. A compensation means is provided for active, especially locally controllable, at least partial compensation of local and/or global distortions of the wafer.

17 Claims, 4 Drawing Sheets

(56) References Cited

FOREIGN PATENT DOCUMENTS

| WO | WO 01/78108 | 10/2001 | |
| WO | WO 2009/133682 | 11/2009 | ............. H01L 21/02 |

OTHER PUBLICATIONS

Office Action from corresponding Taiwanese Patent Application No. 100147527 dated Sep. 9, 2015 (with English translation).

Office Action from corresponding European Patent Application No. 15 150 980.9-1551 dated Nov. 27, 2015.

ACCOMMODATING DEVICE FOR RETAINING WAFERS

FIELD OF THE INVENTION

The invention relates to a receiving means for receiving and mounting of wafers and a device and a method for aligning a first wafer with a second wafer using the receiving means.

BACKGROUND OF THE INVENTION

Receiving means for receiving and mounting of wafers or sample holders or chucks are available in diverse versions and a flat receiving surface or mounting surface is important for the receiving means, so that structures, which are becoming smaller and smaller, can be correctly aligned and bonded on wafer surfaces, which are larger and larger over the entire wafer surface. This is especially important when a so-called prebonding step, which joins the wafers to one another by means of a separable interconnection, is carried out before the actual bond process. High alignment accuracy of the wafers to one another is especially important when an alignment accuracy or especially distortion values of <2 µm are to be achieved for all structures located on one or both wafers. In the vicinity of the alignment marks this succeeds especially well in the indicated receiving means and devices for alignment, so-called aligners, especially bond aligners. With increasing distance from the alignment marks, controlled and perfect alignment with alignment accuracies or especially distortion values better than 2 µm, especially better than 1 µm and even more preferably better than 0.25 µm cannot be achieved.

SUMMARY OF THE INVENTION

The present invention provides improved generic receiving means such that more accurate alignment can be achieved with them.

This object is achieved with the features of the claims.

Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

The invention is based on the finding of the applicant according to European patent applications EP 09012023 and EP 10 015 569(corresponding to U.S. Patent Application Publication Nos. US 2012/0237328 A1 and US 2012/0255365A1, respectively), with the former a detection of the entire surface, especially the positions of the structures on the surface of each wafer as a position map of the wafer being possible. The latter invention relates to a device for determining local alignment errors which have occurred due to strain and/or distortion of the first wafer relative to a second wafer when the first wafer is joined to the second wafer, with the following:
 a first strain map of strain values along a first contact surface of the first wafer and/or
 a second strain map of strain values along a second contact surface and
 evaluation means for evaluating the first and/or second strain maps by which the local alignment errors can be determined. US 2012/0237328 A1 and US 2012/0255365 A1 are hereby incorporated herein by reference.

The basic idea of this invention is to provide a receiving means comprised of several active control elements which are independent of one another and with which the mounting surface of the receiving means can be influenced, especially in shape and/or temperature. Here, the active control elements are used by the corresponding activation such that the local alignment errors or local distortions which are known by means of the position maps and/or strain maps are compensated or for the most part minimized or reduced. Not only are local distortions eliminated, but a macroscopic distortion or stretching of the wafer which arises from the local distortions altogether in its outside dimensions is at the same time minimized or corrected.

Thus, as claimed in the invention, especially in combination with the above described inventions relating to the position maps, strain maps and/or stress maps and the in-situ correction of alignment faults disclosed there during contact-making and bonding of the wafers, it is possible to achieve a still better alignment result by active, especially local action on distortions of the wafer.

According to one advantageous embodiment of the invention, the temperature of the mounting surface can be locally influenced by the compensation means. A local temperature increase of the mounting surface leads to local expansion of the wafer which is held on the mounting surface at this position. The higher the temperature gradient, the more the wafer expands at this position. Based on the data of the position maps and/or strain maps, especially the vector evaluation of the alignment error, especially for each position of the position maps and/or strain maps, it is possible to act on local wafer distortions or to counteract them in a controlled manner.

In this connection vector evaluation is defined as a vector field with distortion vectors, which field has been determined especially by means of one of two versions of the invention described below.

The first version relates to applications in which only one of the two wafers is structured. In this case, it is provided as claimed in the invention that the deviation of the structures is detected, especially the deviation of the geometrical shape from the desired shape. In this case, the deviation of the shape of exposure fields, especially exposure fields of a step & repeat exposure device, from the nominally expected shape which is conventionally rectangular is of special interest. These deviations, especially the vector field which describes these deviations, can take place based on the detection of a position map of the individual alignment marks which correspond to the exposure fields according to EP 09012023 (US 2012/0237328 A1). Alternatively, this vector field can also be determined based on stress maps and/or strain maps which are acquired by means of EP 10 015 569.6 (US 2012/0255365 A1). Advantageously this vector field can however, as claimed in the invention, also be determined by any other suitable measurement means and can be read in. In particular, step & repeat lithography systems which are operated for acquisition of these data with a special test mask and/or a special test routine are suitable for this measurement.

The second version relates to applications in which two wafers are structured. In this case, it is provided as claimed in the invention that the vector field of the alignment deviation be computed for all positions of the position maps, especially of the first and second position maps according to EP 09012023 (US 2012/0237328 A1). This vector field is to be determined especially for the alignment position which is considered ideal according to technological and/or economical criteria according to the material in EP 10 015 569.6 (US 2012/0255365 A1).

In another advantageous embodiment of the invention it is provided that the strain of the mounting surface can be locally influenced by the compensation means, especially by arrangement of piezoelements which can preferably be individually activated on one back of the mounting surface. By stretching or shrinkage, therefore negative stretching, the mounting surface, also the wafer, is deformed accordingly, especially stretched or shrunk, especially by the mounting force acting from the mounting surface on the wafer, wherein the wafer can be influenced in a controlled manner by a corresponding control means based on the values of the strain map which has been determined for this wafer. To the extent the shape of the mounting surface can be locally influenced by the compensation means, especially by preferably mechanical action in one Z direction, there is another possibility for counteracting distortions of the wafer on the mounting surface. Here it also applies that the control of the compensation means takes place by a control means which undertakes a correspondingly dedicated local control of the compensation means based on the values of the position maps and/or strain maps.

The control means encompasses especially software for executing/computing corresponding routines.

According to another advantageous embodiment of the invention, it is provided that the mounting surface can be locally exposed to pressure from the back of the mounting surface, by the compensation means, especially hydraulically and/or pneumatically. In this way the shape of the mounting surface can likewise be influenced so that the aforementioned effects occur. Control likewise takes place again by the above described control means.

Advantageously the compensation means are provided as a plurality of active control elements in the receiving means, especially integrated, preferably embedded into the mounting surface. Thus a receiver of the receiving means can be made monolithic, as is likewise the case in the known receiving means.

Here it is especially advantageous if each control element or groups of control elements can be activated separately. Accordingly, local activation means that a small extract, especially an extract smaller than half the wafer, preferably smaller than ¼ of the wafer, preferably smaller than ⅛ of the wafer, even more preferably smaller than 1/16 of the wafer, can be locally activated by the compensation means. It is especially advantageous if the compensation means can act on each region of the wafer occupied by its own structure with at least one control element.

The device as claimed in the invention comprises the above described control means advantageously in a central control unit which is responsible for all control processes. But, as claimed in the invention, it is conceivable to provide the control means in the receiving means, especially as a module of an overall device.

The method as claimed in the invention can be still further improved by there being one, especially repeated, acquisition of position maps and/or strain maps of the first and/or second wafer after the alignment. Thus, as claimed in the invention after completed alignment, there can be checking of the alignment success. Accordingly, it is conceivable to eliminate a wafer pair with overly large alignment errors in order, for example, to align them again as claimed in the invention or to dispose of them. At the same time the acquired data can be used for self-calibration of the device, especially by the control means.

The inventions disclosed in European patent application EP 09012023.9 (US 2012/0237328 A1) and/or the European patent application EP 10 015 569.6 (US 2012/0255365 A1) will be considered as concomitantly disclosed at the same time as embodiments for this invention.

Other advantages, features and details of the invention will become apparent from the following description of preferred exemplary embodiments and using the drawings.

BRIEF DESCRIPTION OF THE DRAWINGS

FIG. 4b shows a cross sectional view of the receiving means according to cutting line D-D from FIG. 4a.

DETAILED DESCRIPTION OF PREFERRED EMBODIMENTS

Figure 1A:
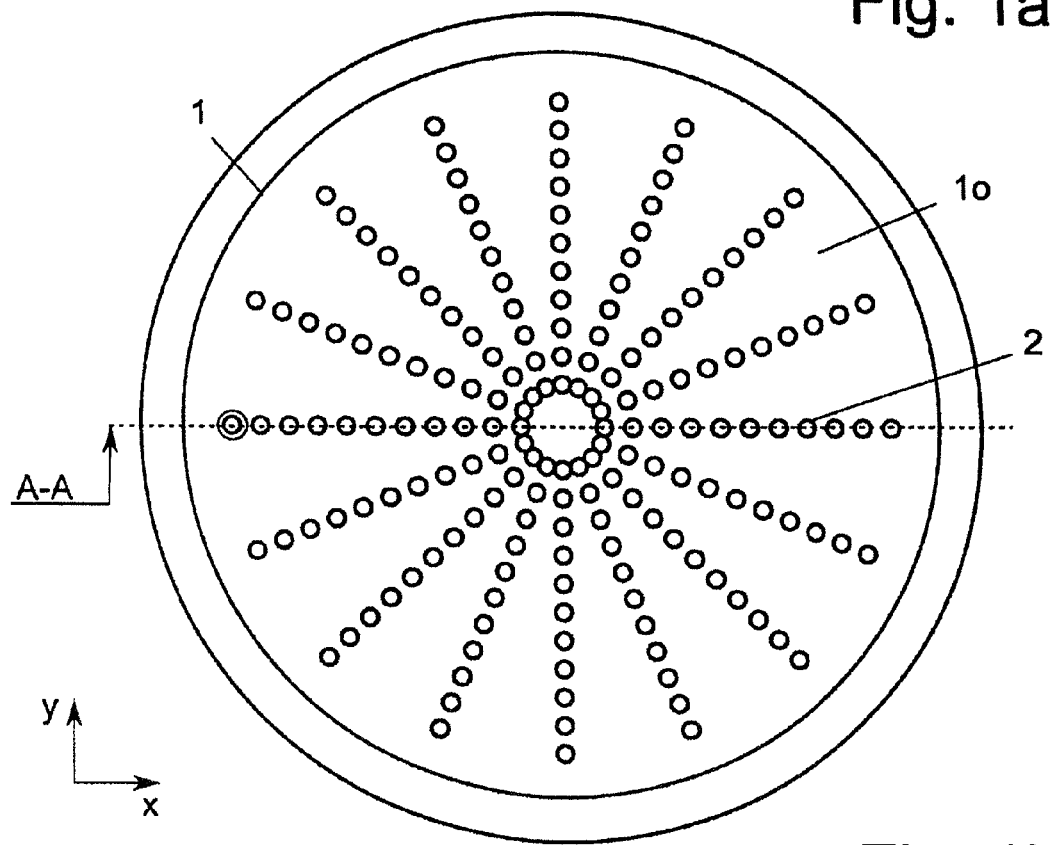
FIG. 1a shows a plan view of a receiving means as claimed in the invention in a first embodiment.
Figure 1B:
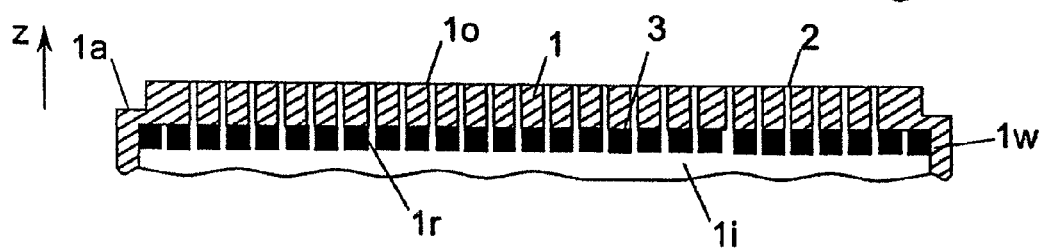
FIG. 1b shows a cross sectional view of the receiving means according to cutting line A-A from FIG. 1a, FIG. 2a shows a plan view of a receiving means as claimed in the invention in a second embodiment.

The same components/features and components/features with the same action are identified with the same reference numbers in the figures.

All four embodiments show a monolithic receiver 1 which, as a flat, preferably circular ring-shaped plate, is provided with a flat mounting surface 1o for receiving and mounting of wafers. On the outer periphery the receiver has a ring-shaped shoulder 1a.

The mounting surface 1o forms a receiving plane for receiving the wafer, which plane extends in the X and Y direction. The Z direction, in which the mounting force acting on the wafer is pointed, runs perpendicular to them. Mounting of the wafer takes place through openings 2 which are arranged uniformly distributed in a plurality over the mounting surface 10 in order to be able to hold the wafer on the mounting surface 1o by applying negative pressure to the openings 2. The larger the number of openings 2 and the smaller the diameter of the openings 2, the less the negative pressure prevailing on the openings 2 for mounting of the wafer leads to distortions of the wafer on the openings 2.

The negative pressure on the openings 2 is applied via a vacuum means which is not shown and which applies negative pressure to an interior space 1i located on the back side of the mounting surface 1o. The interior space 1i is furthermore bordered by a peripheral wall 1w of the receiver 1 and is sealed relative to the vicinity. The openings 2 extend from the mounting surface 1o as far as the interior space 1i and can thus be uniformly exposed to the negative pressure prevailing in the interior space 1i.

The interior space 1i is furthermore bordered by the back 1r located opposite the mounting surface 1o and by the bottom of the interior space 1i which is not shown, the back 1r being penetrated by openings 2.

On the back 1r the active control elements are a plurality of heating/cooling elements, especially exclusively heating elements 3. The heating elements 3 are each activated individually or in groups, control taking place by a control means which is not shown. When one of the heating elements 3 is heated, a local section of the mounting surface 1o is heated by the material with very good heat conduction, especially metal, of the receiver. This leads to local expansion of a wafer which lies on the mounting surface 1o in this region. Thus, for wafers which are held aligned accordingly on the receiving means and with a known position of possible distortions/ strains, a deformation of the wafer can be caused in a controlled manner by switching individual or several heating elements 3 in order to compensate for local distortions. Especially for a plurality of local compensations, this also yields global compensation of global distortions, especially a change of the diameter of the wafer in the X and/or Y direction.

One special advantage of influencing the distortions on the wafer by means of the heating and/or cooling elements lies in the possibility of being able to achieve this with minimum deformation, especially without deformation of the mounting surface and/or especially without deformation of the wafer in the vertical direction or Z direction. In this connection, minimum deformation should be considered to be deformation of the mounting surface and especially of the wafer in the vertical direction or in the Z-direction relative to the support surface of <5 µm, advantageously <2 µm, preferably <1 µm and even more preferably <0.5 µm.

This is especially advantageous for production of prebonding interconnections, for example for prebonds, which are based on van-der-Waals bonds. Based on the fact that here the mounting surface and especially the wafer can be kept flat, the bond wave which is conventional in these prebonding steps is not influenced in its propagation by unevenness. Thus the risk that unbonded sites (so-called voids) remain is greatly reduced. For producing these prebonding interconnections, as claimed in the invention evenness of the mounting surface of <5 µm, advantageously <2 µm, preferably <1 µm and even more preferably <0.5 µm over the entire wafer surface is desired. These evenness values are defined as the distance between the highest and the lowest point within that part of the mounting surface which is in contact with the wafer.

The heating elements 3 are advantageously uniformly distributed under the mounting surface 1o. Advantageously there are more than 10 heating elements 3, especially more than 50 heating elements 3, preferably more than 100 heating elements 3, even more preferably more than 500 heating elements 3, in the receiving means. These heating elements form regions which can be separately activated in the mounting surface and which enable local action on the wafer. Advantageously the individual regions of the mounting surface are thermally insulated from one another with suitable means. In particular, the regions are made in a form which enables a uniform and closed arrangement of the individual segments. Advantageously the execution of the segments as triangles, squares or hexagons is suitable for this purpose.

In particular, Peltier elements are suitable as heating elements 3.

Figure 2A:
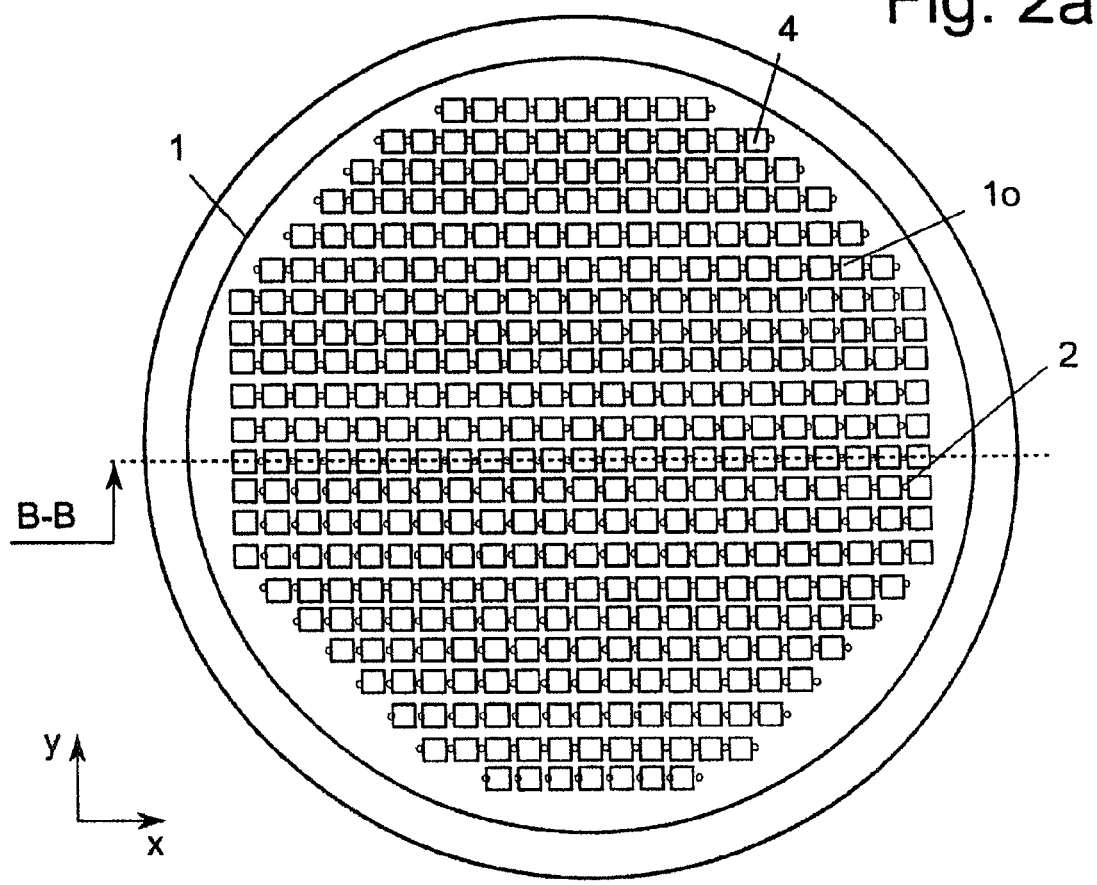
FIG. 2b shows a cross sectional view of the receiving means according to cutting line B-B from FIG. 2a, FIG. 3a shows a plan view of a receiving means as claimed in the invention in a third embodiment.
Figure 2B:
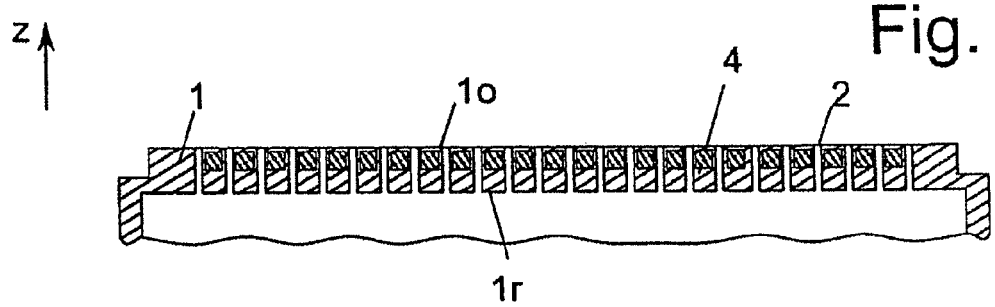

In the second embodiment shown in FIGS. 2a and 2b, heating elements 3 are not shown. I Instead of heating elements 3, or in combination with them, there are piezoelements 4 on the mounting surface 1o, preferably with a greater distance to the back 1r than to the mounting surface 1o.

In this way, a controlled action on the mounting surface 1o is possible. The piezoelements 4 can cause strains in the nanometer to micron range upon activation.

The number of piezoelements 4 can correspond to the aforementioned number of heating elements 3, a combination of the two embodiments being conceivable as claimed in the invention.

Figure 3A:
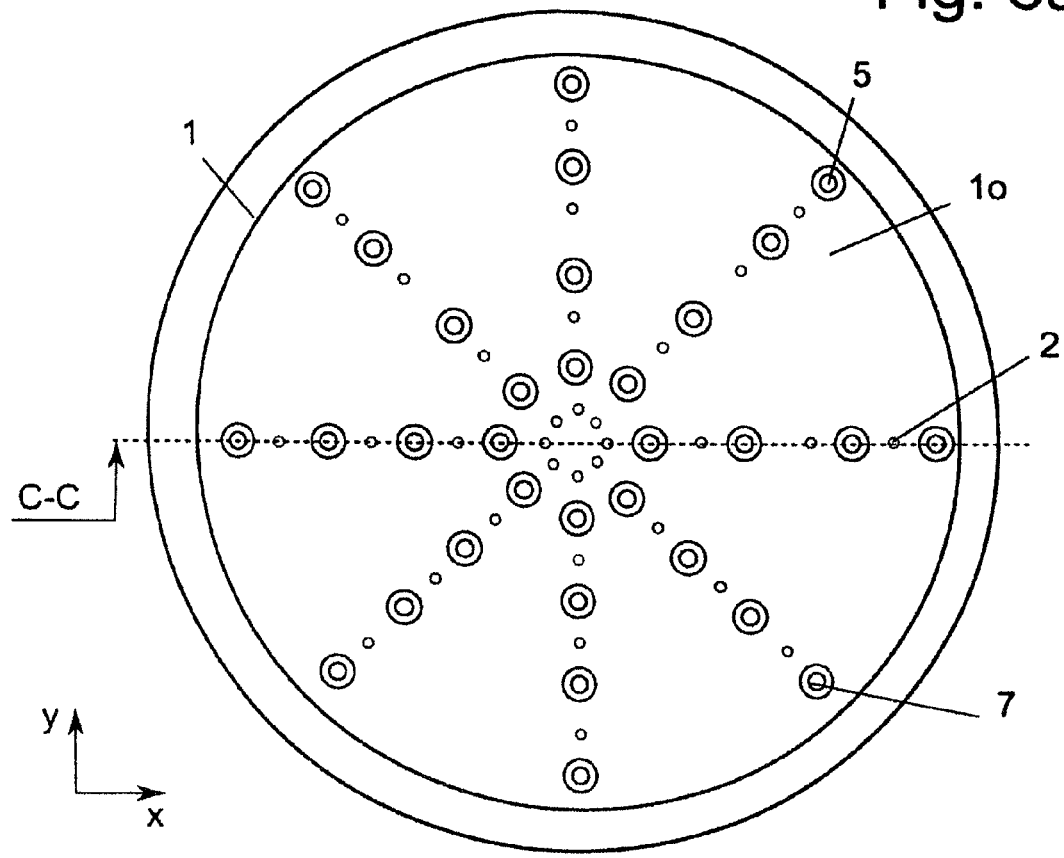
FIG. 3b shows a cross sectional view of the receiving means according to cutting line C-C from FIG. 3a, FIG. 4a shows a plan view of a receiving means as claimed in the invention in a fourth embodiment.
Figure 3B:
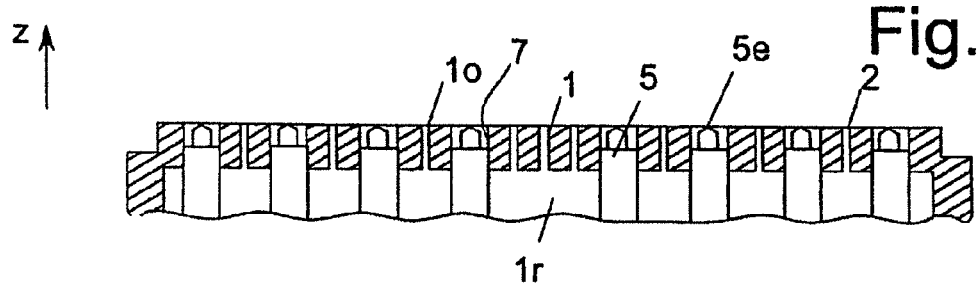

In the third embodiment of the invention shown in FIGS. 3a and 3b, instead of or in combination with the heating elements 3 and/or the piezoelements 4, there are pins 5 which end on the mounting surface 1o with an especially pointed pin end 5e. In the initial position of the pins 5 the pin end 5e is flush with the mounting surface 1o. To the extent there is a local distortion of a wafer in the region of a certain pin 5 as information of the distortion map or strain map, the control means can act locally on the wafer by activating individual or several pins 5 by or near the pin 5 or the pin end 5e being moved in the Z direction in the direction of the wafer. The pin end 5e thus locally exposes the wafer to a compressive force which provides for a local bulging or deflection of the wafer at this point. The pin 5 can be guided to slide as a whole in a guide opening 7 which extends from the mounting surface 1o as far as the back 1r. Alternatively, only the pin end 5e can be moved in the pin 5 and the pin 5 or the lower section of the pin is fixed relative to the guide opening 7. In this way special sealing of the pin 5 or of the pins 5 can be ensured relative to the interior space 1r.

The number of pins 5 corresponds to the number of piezoelements 4 or heating elements 3, here a combination with one or more of the aforementioned embodiments being possible.

Figure 4A:
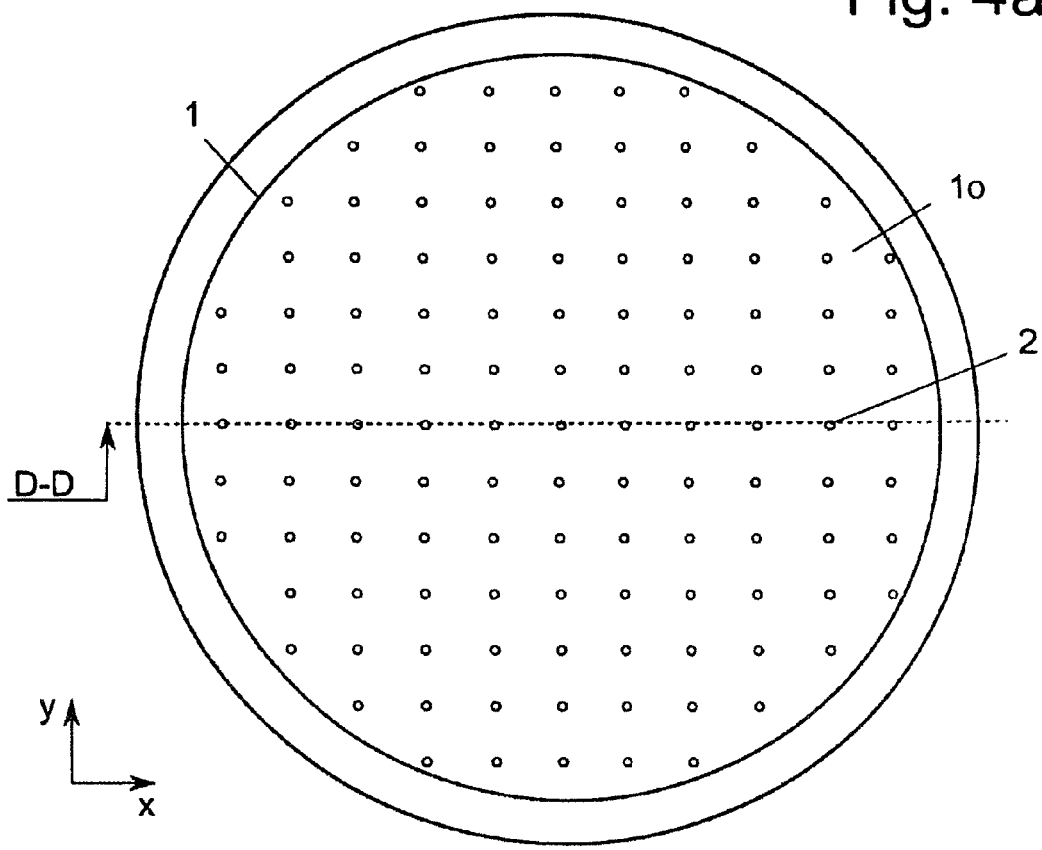
Figure 4B:
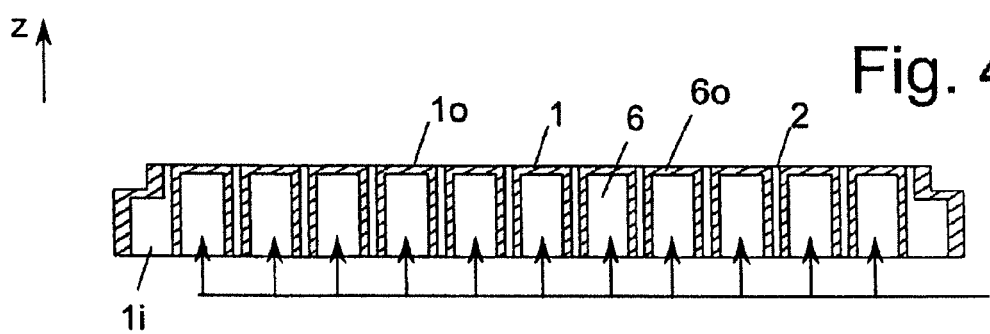

In the embodiment shown in FIG. 4, the receiver 1 has a plurality of pressure chambers 6, each having an upper wall 6o (shown in FIG. 4b) that together form the mounting surface 1o. The pressure chambers 6 extend through the interior space 1i and are sealed relative to this. Each of the pressure chambers 6 or groups of pressure chambers 6 can be separately pressurized, and control by the described control means can take place. The pressure chamber 6 is made, at least on its upper wall 6o, such that it yields when pressure is applied. Therefore the upper wall 6o is made either thinner and/or softer than the other boundary walls of the pressure chambers 6. The openings 2 are connected to the interior space 1i.

As claimed in the invention a simply minimum local deflection of the mounting surface 1o takes place by the aforementioned compensation means 3, 4, 5, 6 by a maximum 3 µm, especially a maximum 1 µm, preferably a maximum 100 nm.

In order to be able to counteract the local distortions with one or more of the aforementioned embodiments, as described above it is necessary that the control means knows where and to what extent or in what direction there are distortions in the wafer. Only then is controlled action or counteraction and compensation of distortions possible. The strain map of each wafer yields information in the form of strain vectors which are distributed over the wafer and which have been determined with a corresponding measurement means according to EP 10 015 569.6 (US 2012/0255365A1). Corresponding control data can be filed in the control unit, especially empirically determined, in order to be able to undertake for each wafer an individual control according to the strain map of the wafer at the positions dictated by the position map of the wafer. Compensation can be carried out automatically in this way during alignment of the wafers.

The active control elements 3, 4, 5, 6 are shown not to scale in the figures and can also have different sizes and shapes.

LIST OF REFERENCE NUMBERS 1 receiver
1a ring-shaped shoulder

1*i* interior space
1*o* mounting surface
1*w* peripheral wall
2 openings
3 heating/cooling elements
4 piezoelements
5 pins
5*e* pin end
6 pressure chambers
6*o* upper wall
7 guide opening Having described the invention, the following is claimed:

1. Device for alignment of a first wafer with a second wafer with the following features:
   a means for determining local alignment errors which have occurred due to strain and/or distortion of the first wafer relative to the second wafer, with a first strain map of the first wafer and/or a second strain map of the second wafer and evaluation means for evaluation of the first and/or second strain maps,
   at least one receiving means for receiving at least one of the wafers, the at least one receiving means including a compensation means for active, at least partial compensation of local and/or global distortions of the wafer and
   alignment means for alignment of the wafers with consideration of position maps and/or strain maps and simultaneous compensation of the local alignment errors by the compensation means of the at least one receiving means.

2. Device as claimed in claim 1, wherein the at least one receiving means further comprises:
   a mounting surface of a monolithic receiver, and
   a plurality of openings, which penetrate the mounting surface, for mounting of the wafer on the mounting surface.

3. Device as claimed in claim 2, wherein the temperature of the mounting surface can be locally influenced by the compensation means.

4. Device as claimed in claim 2, wherein the strain of the mounting surface can be locally influenced by the compensation means by arrangement of piezoelements which can preferably be individually activated on one back of the mounting surface.

5. Device as claimed in claim 2, wherein the shape of the mounting surface can be locally influenced by the compensation means by mechanical action in one Z direction.

6. Device as claimed in claim 2, wherein the mounting surface can be locally exposed to hydraulic or pneumatic pressure from the back of the mounting surface by the compensation means.

7. Device as claimed in claim 2, wherein the compensation means as a plurality of active control elements in the at least one receiving means, are preferably embedded into the mounting surface.

8. Device as claimed in claim 7, wherein each control element or groups of control elements can be activated separately.

9. Method for alignment of a first wafer with a second wafer with the following steps, especially the following sequence:
   detecting a first strain map of the first wafer and/or a second strain map of the second wafer and evaluation of the first and/or second strain maps by evaluation means and determination of the local alignment errors,
   receiving at least one of the wafers on a receiving means, the at least one receiving means including a compensation means for active, at least partial compensation of local and/or global distortions of the wafer and
   aligning the wafers with consideration of position maps and/or strain maps and simultaneous compensation of the local alignment errors by the compensation means of the at least one receiving means.

10. Method as claimed in claim 9, wherein after alignment, there is one detection, especially repeated, detection of position maps and/or strain maps of the first and/or second wafer.

11. Method as claimed in claim 9, wherein the receiving means comprises:
   a mounting surface of a monolithic receiver, and
   a plurality of openings, which penetrate the mounting surface, for mounting of the wafer on the mounting surface.

12. Method as claimed in claim 11, wherein the temperature of the mounting surface can be locally influenced by the compensation means.

13. Method as claimed in claim 11, wherein the strain of the mounting surface can be locally influenced by the compensation means by arrangement of piezoelements which can preferably be individually activated on one back of the mounting surface.

14. Method as claimed in claim 11, wherein the shape of the mounting surface can be locally influenced by the compensation means by mechanical action in one Z direction.

15. Method as claimed in claim 11, wherein the mounting surface can be locally exposed to hydraulic or pneumatic pressure from the back of the mounting surface by the compensation means.

16. Method as claimed in claim 11, wherein the compensation means as a plurality of active control elements in the receiving means, are preferably embedded into the mounting surface.

17. Method as claimed in claim 16, wherein each control element or groups of control elements can be activated separately.

* * * * *